United States Patent
Murakami et al.

(10) Patent No.: US 10,955,527 B2
(45) Date of Patent: Mar. 23, 2021

(54) RADAR SIGNAL PROCESSOR AND RADAR SYSTEM

(71) Applicant: DENSO CORPORATION, Kariya (JP)

(72) Inventors: Tomotoshi Murakami, Kariya (JP); Nobumasa Hasegawa, Kariya (JP); Yoshiyuki Utagawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 149 days.

(21) Appl. No.: 16/396,977

(22) Filed: Apr. 29, 2019

(65) Prior Publication Data
US 2019/0250246 A1 Aug. 15, 2019

Related U.S. Application Data

(63) Continuation of application No. PCT/JP2018/009009, filed on Mar. 8, 2018.

(30) Foreign Application Priority Data

Apr. 19, 2017 (JP) .............................. JP2017-082876

(51) Int. Cl.
*G01S 7/35* (2006.01)
*G01S 13/34* (2006.01)
(Continued)

(52) U.S. Cl.
CPC .............. *G01S 7/354* (2013.01); *G01S 7/352* (2013.01); *G01S 13/34* (2013.01); *G01S 13/343* (2013.01);
(Continued)

(58) Field of Classification Search
None
See application file for complete search history.

(56) References Cited

U.S. PATENT DOCUMENTS 6,031,421 A * 2/2000 McEwan .................. G01S 7/34
330/10
6,972,625 B2 * 12/2005 Nguyen ................. H03F 1/3211
330/253

(Continued)

FOREIGN PATENT DOCUMENTS

JP 2008-172729 A 7/2008

*Primary Examiner* — Peter M Bythrow
(74) *Attorney, Agent, or Firm* — Posz Law Group, PLC

(57) ABSTRACT

A radar system includes a transmitter circuit, which transmits a radar wave having a chirp frequency gradually increasing or decreasing to a target, and a frequency conversion circuit, which demodulates a signal of the radar wave reflected at the target by frequency-conversion in correspondence to the chirp frequency. A radar signal processor includes a variable amplifier connected to an output side of the frequency conversion circuit, and a feedback circuit which detects an output of the variable amplifier as a detection signal and feeds back a signal of a frequency band included in the detection signal to an input of the variable amplifier. The feedback circuit is configured to cut off and not cut off a frequency band including a DC offset transient response frequency, which occurs at time of frequency conversion by the frequency conversion circuit, during a (Continued)

specified period and a period other than the specified period, respectively. The specified period is a predetermined first period from starting of a demodulation operation of the frequency conversion circuit and/or a predetermined second period from ending of the demodulation operation of the frequency operation of the frequency conversion circuit.

7 Claims, 17 Drawing Sheets

(51) Int. Cl.
*H03F 3/195* (2006.01)
*H03F 1/34* (2006.01)
*H03D 7/00* (2006.01)
*H04B 1/30* (2006.01)
*H03F 3/45* (2006.01)
*G01S 13/931* (2020.01)
*H04B 1/16* (2006.01)

(52) U.S. Cl.
CPC .............. *G01S 13/931* (2013.01); *H03D 7/00* (2013.01); *H03F 1/34* (2013.01); *H03F 3/195* (2013.01); *H03F 3/45475* (2013.01); *H04B 1/16* (2013.01); *H04B 1/30* (2013.01); *H03F 2200/129* (2013.01); *H03F 2200/156* (2013.01); *H03F 2200/267* (2013.01); *H03F 2200/333* (2013.01); *H03F 2200/375* (2013.01); *H03F 2200/451* (2013.01)

(56) References Cited

U.S. PATENT DOCUMENTS

| | | | | |
|---|---|---|---|---|
| 7,071,868 | B2* | 7/2006 | Woodington | G01S 13/343 342/70 |
| 7,379,013 | B2* | 5/2008 | Dean | G01S 13/34 342/128 |
| 2006/0022866 | A1* | 2/2006 | Walton | H01Q 9/0407 342/194 |
| 2007/0152871 | A1* | 7/2007 | Puglia | G01S 7/352 342/70 |
| 2007/0285307 | A1* | 12/2007 | Nishijima | G01S 7/35 342/200 |
| 2009/0256739 | A1* | 10/2009 | Teshirogi | G01S 7/285 342/204 |
| 2009/0256740 | A1* | 10/2009 | Teshirogi | G01S 7/282 342/204 |
| 2014/0168004 | A1* | 6/2014 | Chen | G01S 7/282 342/118 |
| 2015/0061769 | A1* | 3/2015 | Bodnar | H03G 3/001 330/282 |
| 2016/0033625 | A1* | 2/2016 | Floyd | G01S 7/4021 342/174 |
| 2016/0077196 | A1* | 3/2016 | Dehlink | G01R 31/2822 342/169 |
| 2017/0090014 | A1* | 3/2017 | Subburaj | G01S 7/4052 |
| 2017/0115377 | A1* | 4/2017 | Giannini | G01S 7/35 |
| 2019/0049557 | A1* | 2/2019 | Kamimura | G01S 13/34 |

* cited by examiner

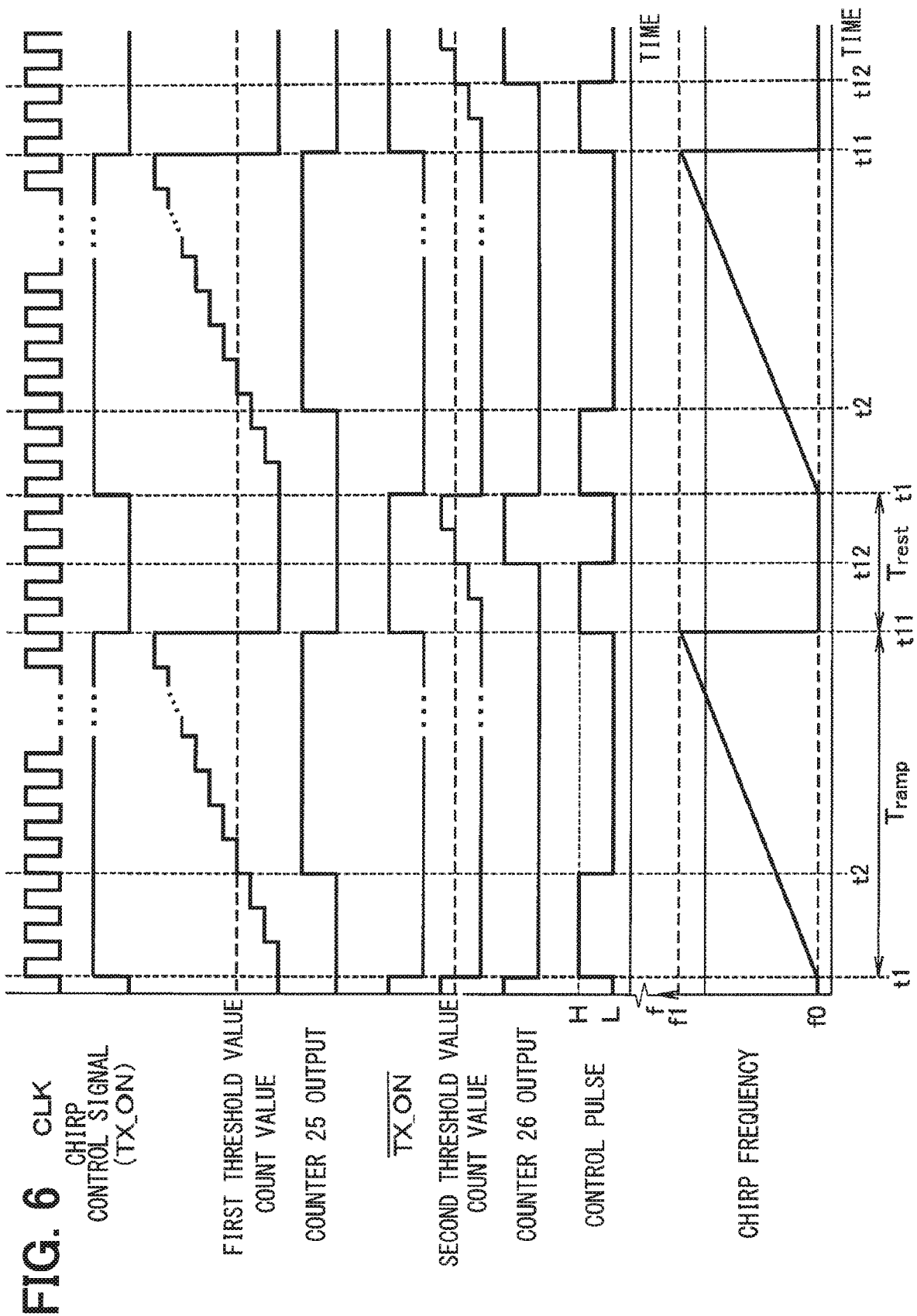

FIG. 7A  COMPARATIVE EXAMPLE
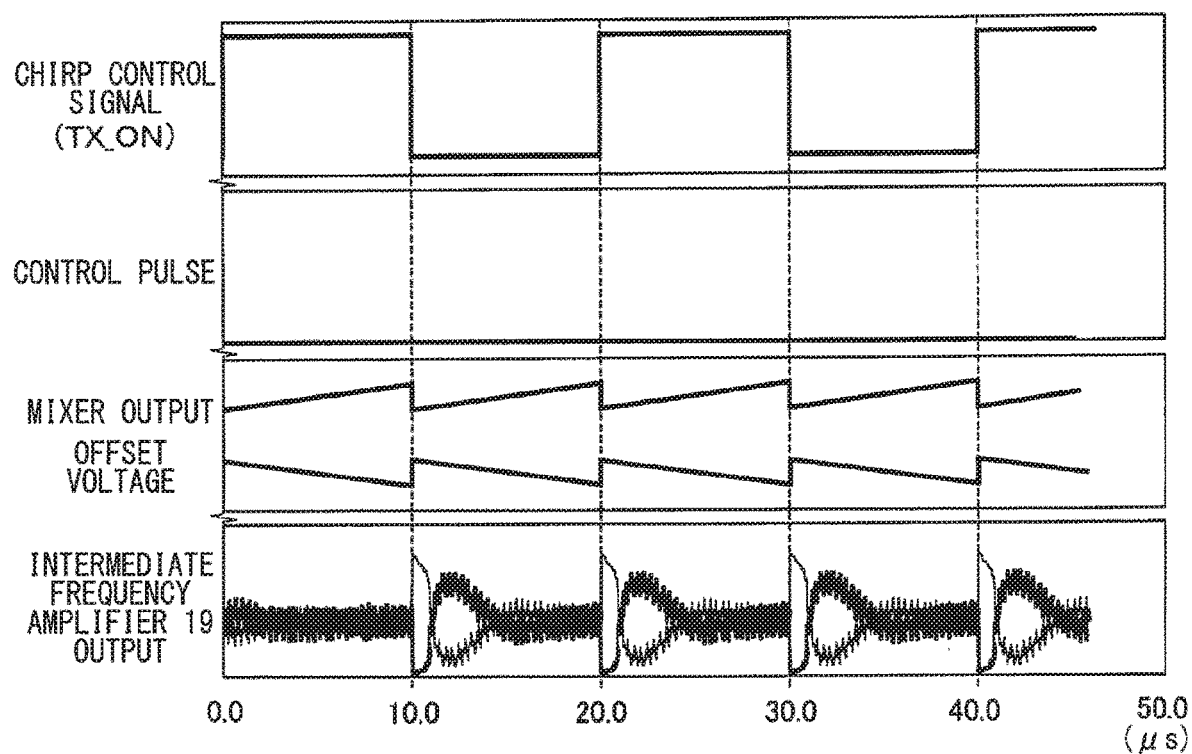
FIG. 7B  COMPARATIVE EXAMPLE
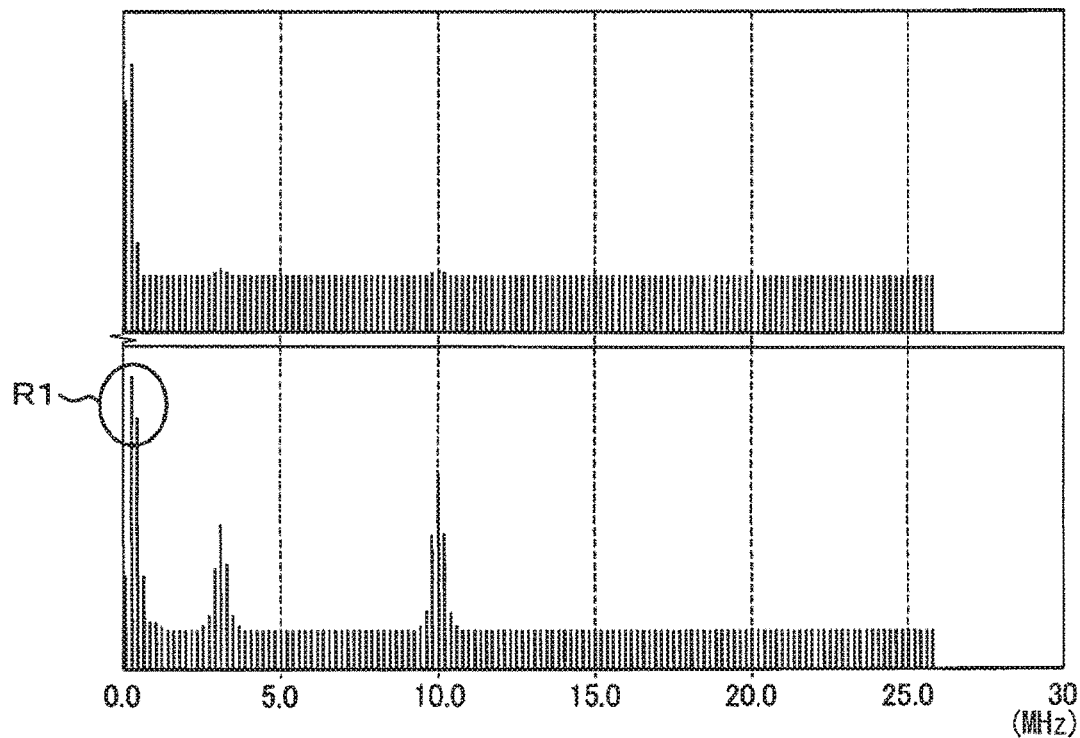

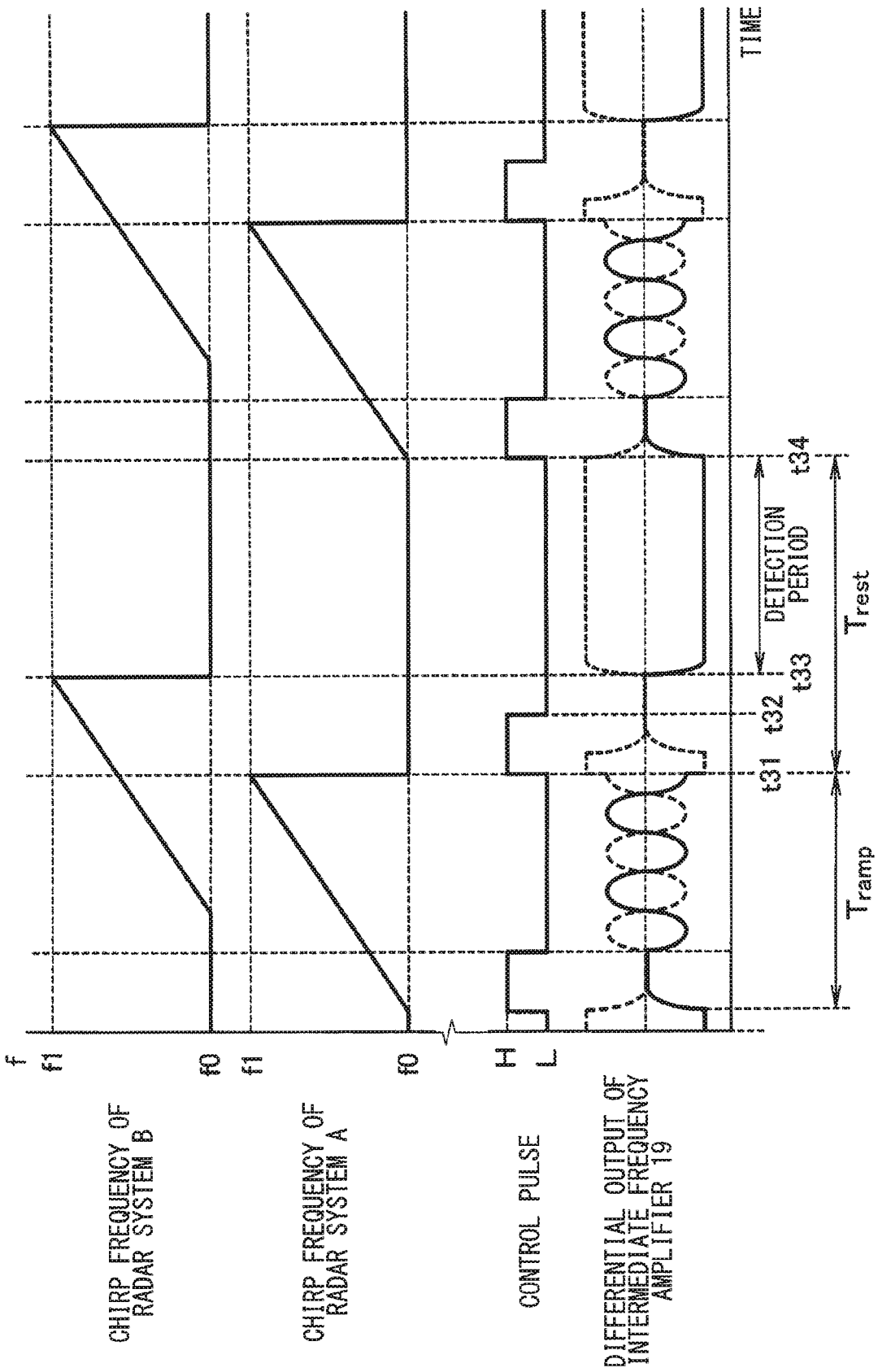

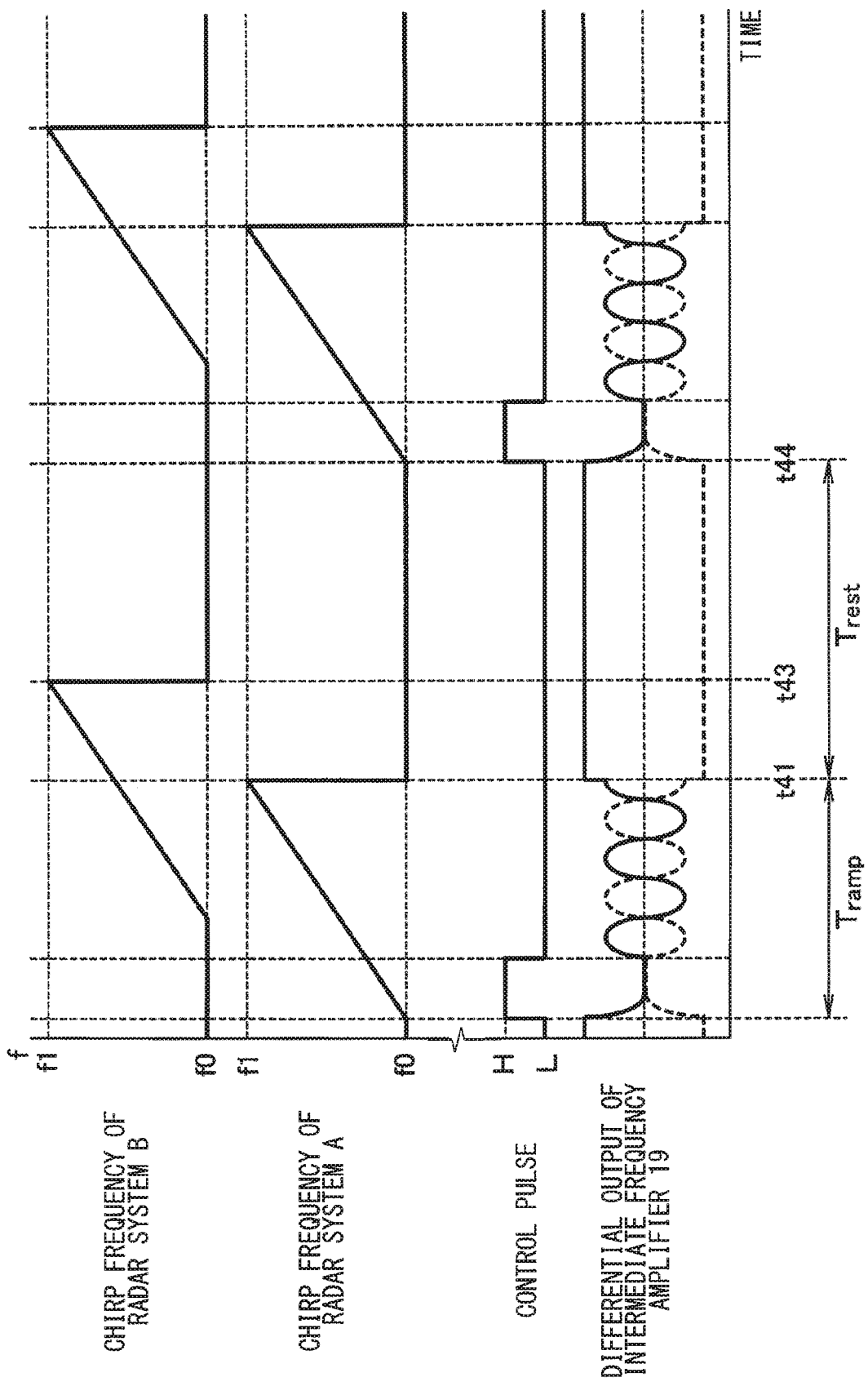
FIG. 17 COMPARATIVE EXAMPLE

RADAR SIGNAL PROCESSOR AND RADAR SYSTEM

CROSS REFERENCE TO RELATED APPLICATION

The present application is a continuation application of International Patent Application No. PCT/JP2018/009009 filed on Mar. 8, 2018, which designated the U.S. and claims the benefit of priority from Japanese Patent Application No. 2017-082876 filed on Apr. 19, 2017, the whole disclosures of which are incorporated herein by reference.

FIELD

The present disclosure relates to a radar signal processor, which shapes a waveform of a frequency-converted signal of a reception signal of a radar wave, and a radar system.

Recently, many technologies such as collision prevention and automated driving are proposed. Among such technologies, a technology for measuring a distance from a subject device to a target using a radar technology attracts attention. For example, a millimeter wave band radar device is proposed for vehicles as a device for measuring a distance from a subject device to a target. Various electronic components are incorporated in this radar device. The electronic components include, for example, a radar signal processor which converts a frequency of a radar wave signal at the time of reception and then shapes a waveform.

SUMMARY

According to the present disclosure, a radar signal processor is provided for a radar system including a transmitter circuit, which transmits a radar wave having a chirp frequency gradually changing to a target, and a frequency conversion circuit, which demodulates a signal of the radar wave reflected at the target by frequency conversion in correspondence to the chirp frequency. The radar signal processor comprises an amplifier circuit including a variable amplifier and a feedback circuit. The variable amplifier is connected to an output side of the frequency conversion circuit. The feedback circuit is configured to detect an output signal of the variable amplifier as a detection signal and feeds back a signal of a frequency band included in the detection signal to an input of the variable amplifier.

BRIEF DESCRIPTION OF THE DRAWINGS

The above and other objects, features and advantages of the present disclosure will become more apparent from the following detailed description made with reference to the accompanying drawings. In the drawings:

FIG. 6 is a time chart schematically showing a method of generating a control pulse for setting a mask period in a vicinity of starting a chirp and ending a chirp;

FIG. 7A is a chart showing a time change of a simulation result with a DC offset in a comparative example;

FIG. 7B is a chart showing a simulation result indicating frequency components of a DC offset in the comparative example;

FIG. 16 is a time chart schematically showing a method of distinguishing from an arrival wave of the other radar system in case of setting a mask period in a vicinity of starting a chirp and ending a chirp; and FIG. 17 is a time chart schematically showing a DC offset component at the time of detecting a wave arriving from the other radar system in a comparative example.

EMBODIMENT

Figure 1:
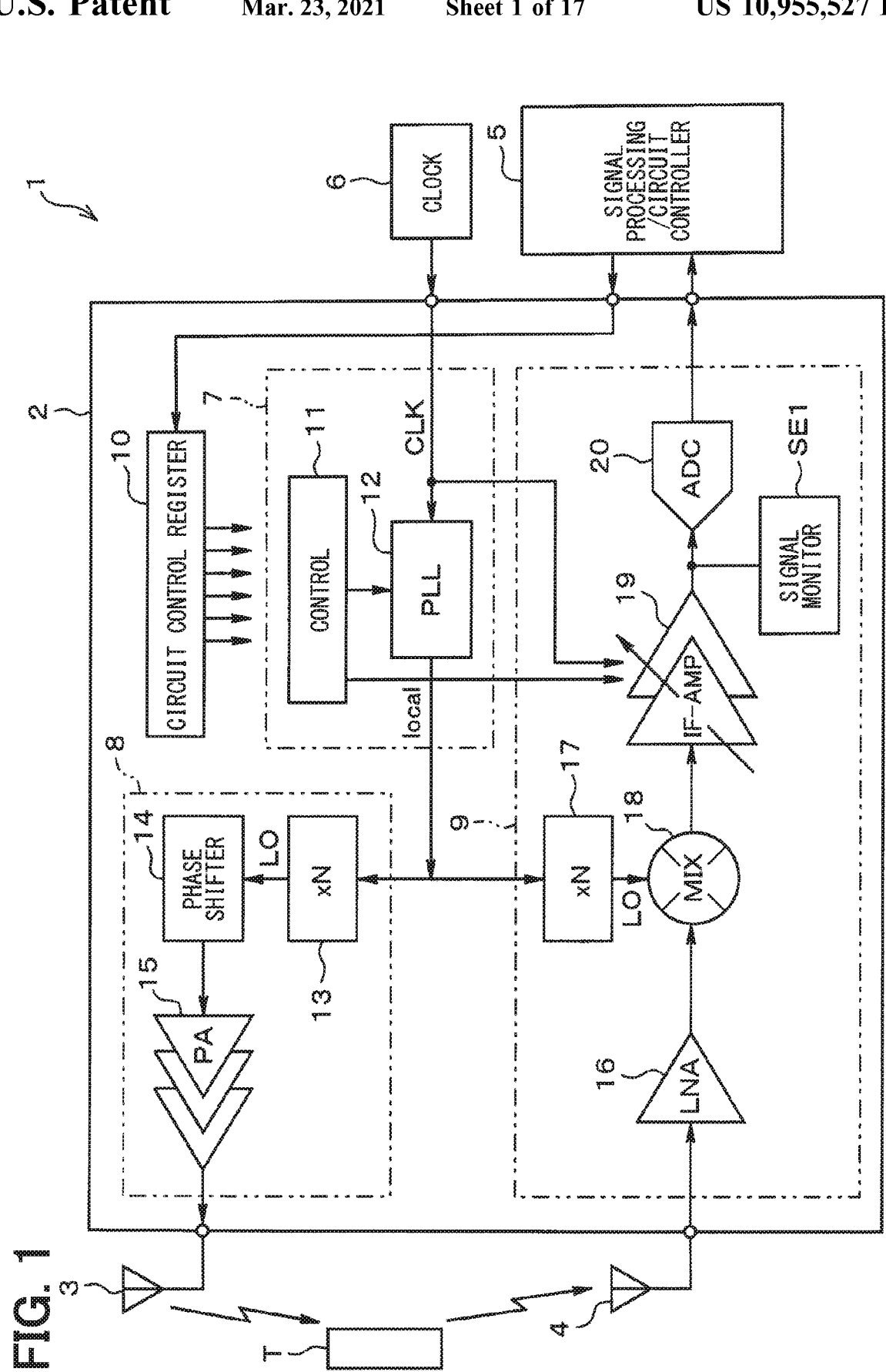
FIG. 1 is an electric circuit diagram showing a radar system according to a first embodiment.

Hereinafter, a radar signal processor and a radar system will be described with reference to the accompanying drawings. In each embodiment described below, same or similar reference numerals are attached to configurations of same or similar operations thereby to simplify the description. In each of the embodiments, same reference numerals are used to designate same or similar configurations in last two digits of the reference numerals. In the following description, the embodiments are directed to a millimeter wave radar system.

First Embodiment

Referring first to FIG. 1 schematically showing an entire configuration of an entire system, a millimeter wave radar system 1 is provided to be capable of transmitting a radar wave to a front part of a subject vehicle, and performing transmission and reception of the radar wave of a millimeter wave band (for example, 80 GHz band: 76.5 GHz).

The millimeter wave radar system 1 includes a one-chip type transceiver-mounted IC 2, a transmission antenna 3, a reception antenna 4, a controller 5 and a reference oscillation circuit 6 using a crystal oscillator. The transceiver-mounted IC 2 and the controller 5 may be integrally formed in one chip or may be separated from one another. The controller 5 and the reference oscillation circuit 6 are connected to the transceiver-mounted IC 2. The reference oscillation circuit 6 generates a reference clock CLK having a certain reference frequency, and outputs the reference clock CLK to a modulation/demodulation signal generation circuit 10 provided inside the transceiver-mounted IC 2.

The transceiver-mounted IC 2 includes the modulation/demodulation signal generation circuit 7, a transmitter circuit 8, a receiver circuit 9 and a circuit control register 10 and is configured as a semiconductor integrated circuit device. The modulation/demodulation signal generation circuit 7 includes a control circuit 11 and a PLL circuit 12. The transmitter circuit 8 includes an N multiplier 13 for multiplying a local signal by N, a phase shifter 14 for shifting a signal LO outputted from the N multiplier 13, and an amplifier circuit 15 for amplifying an output signal of the phase shifter 14. The receiver circuit 9 includes a low-noise amplifier 16, an N multiplier 17, a frequency conversion circuit 18 serving as a mixer, an intermediate frequency (IF) amplifier circuit 19 and an A/D converter 20. The controller 5 performs internal command processing and circuit control processing of the transceiver-mounted IC 2 in response to writing of a frequency command such as an initial frequency f0 and an end frequency f1 as well as a parameter such as an amplification factor of the intermediate frequency amplifier circuit 19 (particularly of a variable amplifier 23 shown in FIG. 2) into the circuit control register 10.

The control circuit 11 generates a command signal (from initial frequency f0 to end frequency f1) for gradually increasing or gradually decreasing the frequency relative to time, for example, in accordance with the frequency command applied to the circuit control register 10, and outputs it to the PLL circuit 12. Here, the modulation/demodulation signal generation circuit 7 is exemplified to generate a sawtooth wave for generation of a radar wave signal modulated according to the sawtooth wave and transmission of the radar wave to the target T, and demodulate a signal reflected from the target T according to the above-described sawtooth wave.

In addition, the control circuit 11 generates various control commands (for example, a chirp control signal TX_ON, control pulse) and outputs it to the intermediate frequency amplifier circuit 19, thereby to control a function of the intermediate frequency amplifier circuit 19. The control circuit 11 is used as a chirp control signal generation circuit for generating the chirp control signal TX_ON indicating starting and ending a chirp demodulation.

The modulation/demodulation signal generation circuit 7 generates, upon receiving the reference clock of the reference oscillation circuit 6, a signal gradually increasing or decreasing the frequency within a predetermined standard frequency band by a predetermined modulation method and outputs a generated signal as a high-precision local signal. This local signal local is adjusted to have a frequency Fmod/N (N is a multiplication number of the N multipliers 13 and 17 described later), and is outputted to the transmitter circuit 8 and the receiver circuit 9. In this example, the modulation/demodulation signal generation circuit 7 generates the local signal having the frequency Fmod/N by gradually increasing or decreasing by using a predetermined modulation method. The modulation/demodulation signal generation circuit 7 may alternatively generate the local signal having the modulation/demodulation frequency Fmod in case of no provision of the N multipliers 13 and 17.

The N multiplier 13 multiplies the output of the modulation/demodulation signal generation circuit 7 by N. A local signal after the N multiplication is referred to as the local signal LO. Therefore, a frequency of the local signal LO of the N multiplier 13 becomes a modulation/demodulation frequency Fmod. The phase shifter 14 shifts a phase of the output signal of the N multiplier 13, and the amplifier circuit 15 amplifies an output signal of the phase shifter 14. Therefore, a frequency of a transmission signal from the transmitter circuit 8 becomes the modulation frequency Fmod.

The transmission signal of the transmitter circuit 8 is transmitted externally through the transmission antenna 3 as the radar wave. The phase shifter 14 is provided to shift the phase of the signal outputted from the N multiplier 13. Although shown only schematically in the figure, the transmission antenna 3 includes multiple antenna elements such as planar antennas formed of patch antennas, for example. The phase shifter 14 is connected, for example, to each of a plurality of antenna elements forming the transmission antenna 3, and changes a phase corresponding to each antenna element. As a result, a transmission direction can be adjusted by the beam forming technology. As the phase shifter 14, a line switching type phase shifter, a reflection type phase shifter or the like can be used.

As shown in FIG. 1, the radar wave outputted from the transmission antenna 3 is reflected by the target T and become a reflected signal. The reflected signal is received by the reception antenna 4. The reception antenna 4 is also formed of a planar antenna using a patch antenna, for example, and receives the radar wave. Although not shown, the antenna elements of the transmission antenna 3 and the reception antenna 4 are arranged in parallel so that distances between the antenna elements adjacent to each other are equal to each other.

The receiver circuit 9 receives the reflection signal through the reception antenna 4. The low noise amplifier 16 amplifies a received signal with a predetermined amplification factor and outputs an amplified signal to the mixer 17. The N multiplier 17 multiplies the output signal of the PLL 12 by N and outputs it to the frequency conversion circuit 18. The frequency conversion circuit 18, mixes an output signal of the low noise amplifier 16 with the modulated signal outputted from the N-multiplier 17, and outputs a mixed and frequency-converted signal to the intermediate frequency amplifier circuit 19. The frequency conversion circuit 18 outputs a differential signal produced by mixing the output signal of the low noise amplifier 16 and the output local signal LO of the N multiplier 17 to the intermediate frequency amplifier circuit 19. A signal monitor SE1 is connected to an output stage of the intermediate frequency amplifier circuit 19. The signal monitor SE1 is configured to detect a DC offset component included in the output signal of the intermediate frequency amplifier circuit 19. In the present embodiment, the signal monitor SE1 is shown to detect an output analog signal of the intermediate frequency amplifier circuit 19. It may however be connected to monitor an output digital signal of the A/D converter 20 as far as it is capable of monitoring the output signal of the intermediate frequency amplifier circuit 19.

Figure 2:
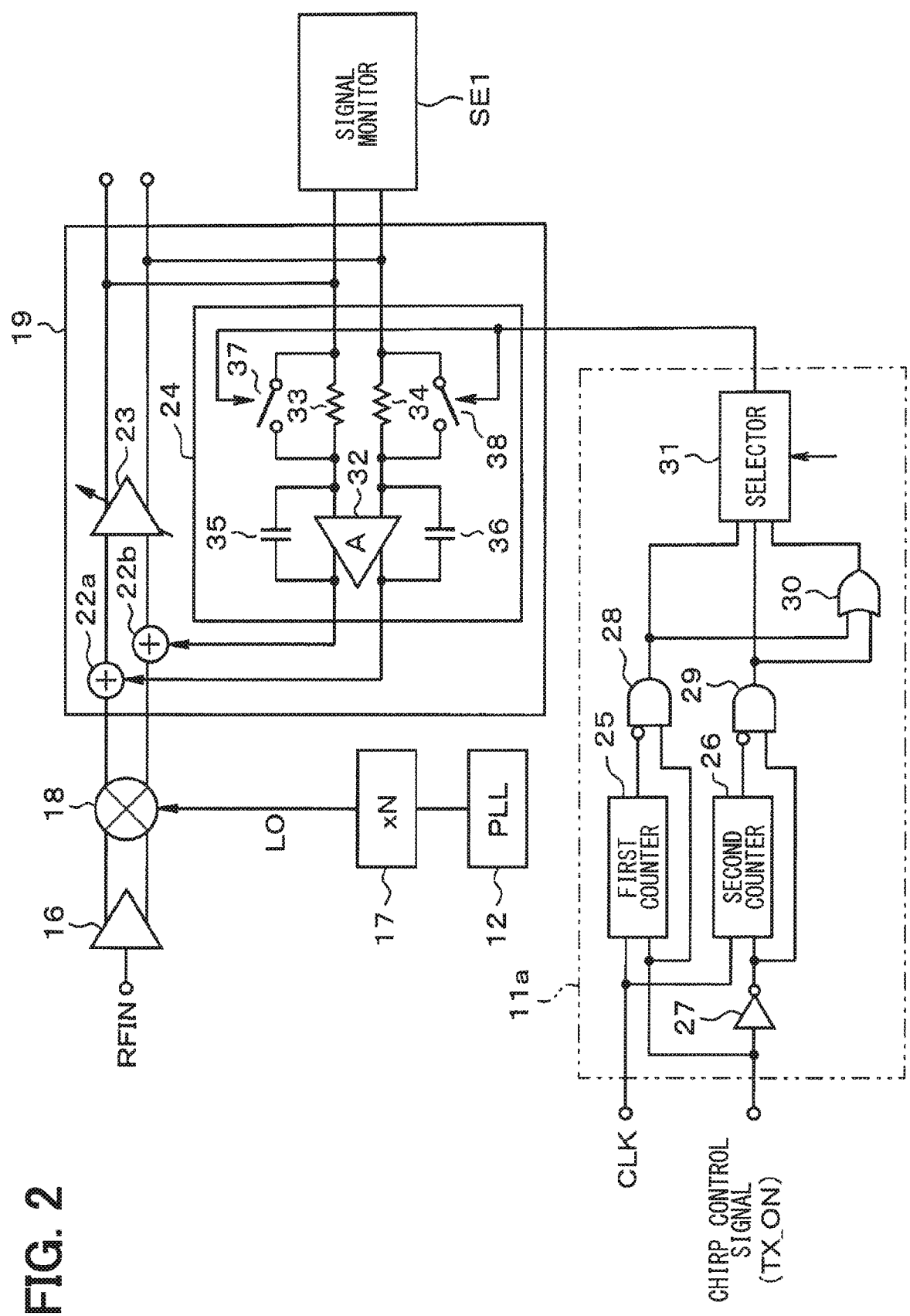
FIG. 2 is an electric circuit diagram showing a part of a radar signal processor and a control circuit.

A configuration example of the intermediate frequency amplifier circuit 19 and a part 11a of the control circuit 11 is shown in FIG. 2. The part 11a is also referred to as the control circuit. As shown in FIG. 2, the intermediate frequency amplifier circuit 19 is used as an amplifier circuit including adders 22a, 22b, a variable amplifier 23 and a feedback circuit 24.

The adders 22a and 22b add the output signal of the frequency conversion circuit 18 and an output signal of the feedback circuit 24 and output addition results to the variable amplifier 23. The variable amplifier 23 amplifies a difference between outputs of the adders 22a and 22b with an amplification factor set by the circuit control register 10, and applies an amplified difference to the A/D converter 20 and the feedback circuit 24. The feedback circuit 24 includes an amplifier 32, resistors 33, 34, capacitors 35, 36 and switches 37, 38 provided as bypass switches. The feedback circuit 24 is configured to detect the output of the variable amplifier 23 and feeds back a signal of a frequency band included in the detection signal to the input of the variable amplifier 23. The feedback circuit 24 normally performs, for example, high-pass filter processing on the output signal of the variable amplifier 23 and outputs it to the adders 22a and 22b.

The control circuit 11a is configured by combining a first counter 25, a second counter 26, logic gates 27 to 30 and a selector 31 in the illustrated form to function as a control pulse generation circuit. The control circuit 11a receives the reference clock CLK and the chirp control signal TX_ON and outputs ON/OFF control signals to the switches 37 and 38 of the feedback circuit 24 according to these signals. The feedback circuit 24 is configured to receive this control signal and feeds back the output signal of the variable amplifier 23 to the adders 22a and 22b.

The first counter 25 receives and counts the reference clock CLK while the chirp control signal TX_ON is at a high level "H." The second counter 26 receives the chirp control signal TX_ON through the NOT gate 27 and receives and counts the reference clock CLK while the chirp control signal TX_ON is at a low level "L."

The AND gate 28 receives an output signal of the first counter 25 in an inverted logic level and the chirp control signal TX_ON, and outputs an AND logic operation result to the selector 31. The AND gate 29 receives an output signal of the second counter 26 in an inverted logic level and the chirp control signal TX_ON after level inversion by the NOT gate 27, and outputs an AND logic operation result to the selector 31. The OR gate 30 receives output signals of the AND gates 28 and 29 and outputs an OR logic operation result to the selector 31. The selector 31 selects either one of three outputs of the AND gates 28, 29 and the OR gate 30 based on a control signal of the control circuit 11 and applies a selected output signal as the control signal for the switches 37 and 38 of the feedback circuit 24. As a result, the control circuit 11a can change and control an RC time constant of a high-pass filter related to the feedback unit 24 by controlling the switches 37 and 38 of the feedback circuit 24 to turn on and off.

The intermediate frequency amplifier circuit 19 outputs the signal amplified by the variable amplifier 23 to the A/D converter 20 shown in FIG. 1. The A/D converter 20 converts the amplified analog signal into a digital signal and outputs the digital signal to the controller 5. The controller 5 includes a microcomputer having, for example, a CPU, a ROM, a RAM and the like (all not shown), and acquires digital data converted by the receiver circuit 9. The controller 5 calculates information related to the target T by executing signal processing on the digital data acquired from the receiver circuit 9. The target T may include vehicles such as a preceding vehicle other than the subject vehicle provided with the radar system 1 shown in FIG. 1, a roadside object on a road or the like. The information related to the target T may include distance, relative speed, direction or the like.

Figure 3:
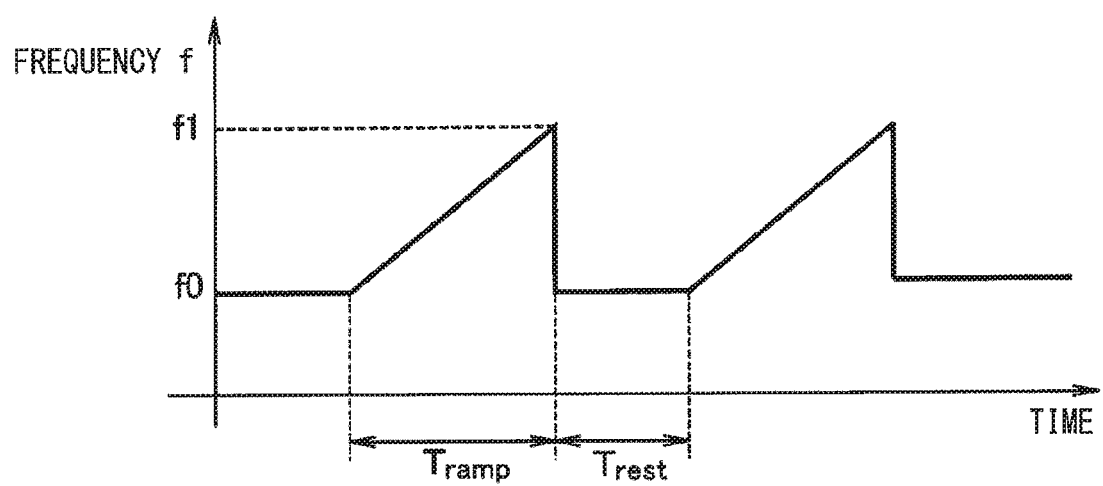
FIG. 3 is a time chart showing an example of a change in a chirp frequency.

An exemplary operation of a characteristic circuit part of the above-described configuration will be described next. FIG. 3 schematically shows a change in a chirp frequency f of the output local signal LO caused by the N multiplier 17 as a result of the control command outputted from the control circuit 11 to the PLL 12. As shown in FIG. 3, after the frequency f is linearly increased (gradually increased) from an initial frequency f0 to an end frequency f1 during a predetermined first period Tramp in a saw-tooth manner, the frequency f is instantaneously switched back to the initial frequency f0 and maintained to remain constant at the initial frequency f0 during a predetermined second period Trest. This frequency change pattern during these periods Tramp and Trest is repeated.

Figure 4:
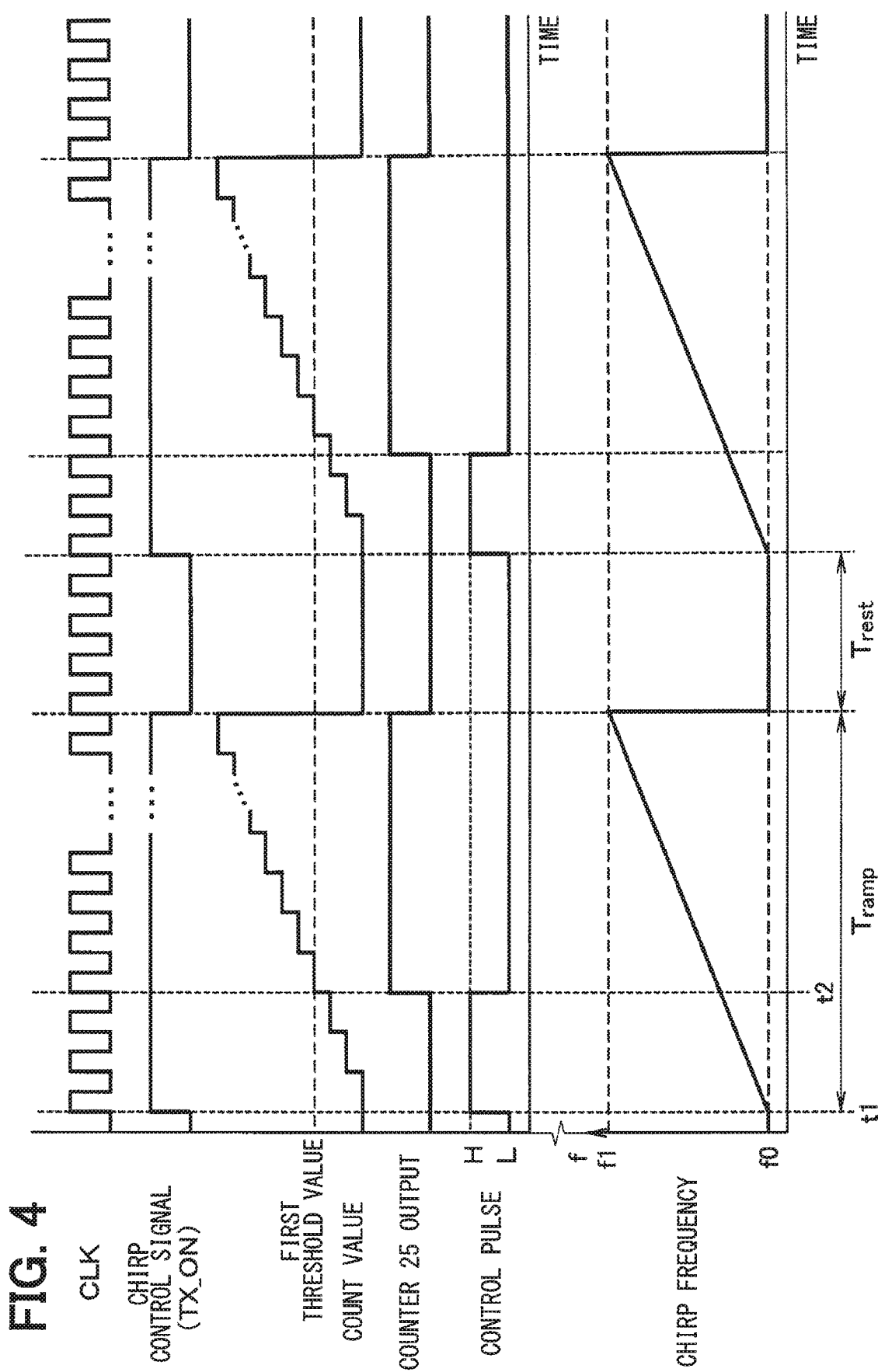
FIG. 4 is a time chart schematically showing a method of generating a control pulse for setting a mask period in a vicinity of starting a chirp.

FIG. 4 schematically shows an operation in case that the selector 31 selects the output of the AND gate 28 in response to the control signal outputted from the control circuit 11 to the selector 31. The first counter 25 starts counting the reference clock CLK from time t1 at which the chirp control signal TX_ON changes to "H."

When the control circuit 11 controls the selector 31 to select the output of the AND gate 28, the control circuit 11a outputs the control pulse "H" to the switches 37 and 38 until time t2 at which the count value of the first counter 25 reaches a predetermined first threshold value. As a result, the switches 37 and 38 are controlled to be in an on-state by generating the control pulse "H" during the predetermined first period from time t1 at which the demodulation starts with the chirp frequency f in the period Tramp. The predetermined first period is set to be shorter than the period Tramp.

Figure 5:
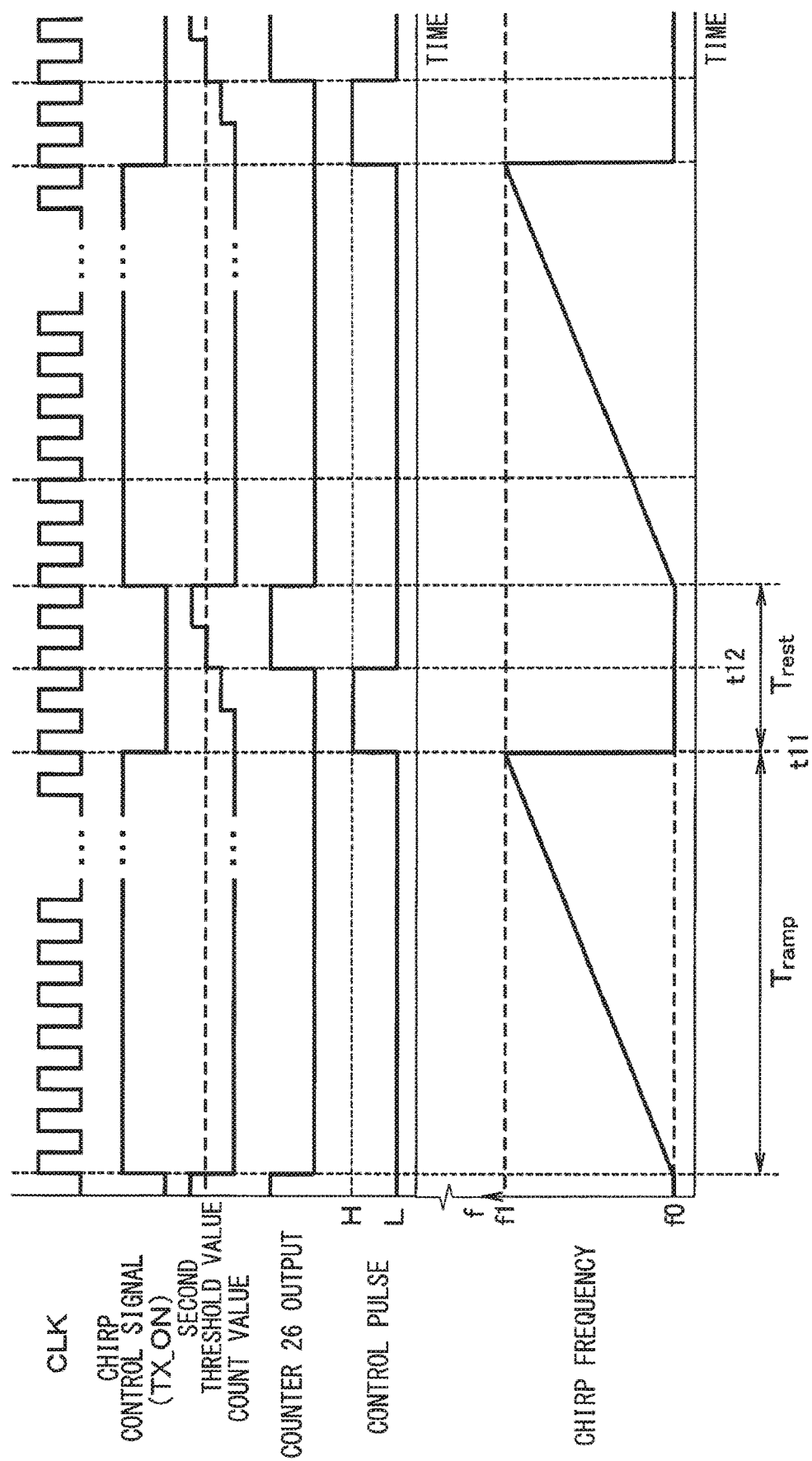
FIG. 5 is a time chart schematically showing a method of generating a control pulse for setting a mask period in a vicinity of ending a chirp.

FIG. 5 schematically shows a case that the selector 31 selects the output of the AND gate 29 in response to the control signal outputted from the control circuit 11 to the selector 31. The second counter 26 starts counting the reference clock CLK from time t11 at which the chirp control signal TX_ON changes from "H" to "L."

When the control circuit 11 controls the selector 31 to select the output of the AND gate 29, the control circuit 11a outputs the control pulse until time t12 at which the count value of the second counter 26 reaches a predetermined second threshold value. Thus, the chirp frequency f is gradually increased from the initial frequency f0 to the end frequency f1 during the period Tramp, and then the control pulse is generated to turn on the switches 37 and 38 during the predetermined second period from time t11 at which the chirp frequency f is instantaneously returned from the end frequency f1 to the initial frequency f0. The predetermined second period is set to be shorter than the period Tramp.

FIG. 6 schematically shows a case that the selector 31 selects the output of the OR gate 30 in response to the control signal outputted from the control circuit 11 to the selector 31. When the selector 31 selects the output of the OR gate 30, the control pulse is outputted until the count value of the first counter 25 or 26 reaches the predetermined first threshold value or the second threshold value in the period that the output of either one of the AND gates 28 and 29 is "H" (from time t1 to time t2 and from time t11 to time t12 in FIG. 6). As described above, the switches 37 and 38 are controlled to be in the on-state by the control pulse "H" generated during the predetermined first period from time t1 at which the demodulation starts by the chirp frequency f and the predetermined second period from time t11 at which the demodulation ends with the chirp frequency.

Comparative Example

FIG. 7A and FIG. 7B show simulation results of a state of occurrence of DC offset in case of feedback by the feedback circuit 24 without generating the control pulse by the control circuit 11a, specifically by the selector 31. In this case, IF band frequencies 3 MHz and 10 MHz are fixedly used. As shown in FIG. 7A, a DC offset transient response component is largely included in the output of the intermediate frequency amplifier circuit 19 from time at which the output frequency of the frequency conversion circuit 18 starts increasing, and thereafter the DC offset transient response component gradually decreases. For example, the columns of 10.0 to 20.0 (μs), 20.0 to 30.0 (μs), etc. in FIG. 7A. FIG. 7B shows an output frequency distribution of the intermediate frequency amplifier circuit 19. Specifically, an upper half of FIG. 7B shows the input signal, which includes the sine wave signals of 3 MHz and 10 MHz with the DC component and is applied to the intermediate frequency amplifier 19 in a manner that a time waveform of the mixer output offset voltage shown in FIG. 7A is converted into frequency ranges. A lower half of FIG. 7B shows a frequency spectrum of the output signal of the intermediate frequency amplifier 19 in correspondence to the output of the intermediate frequency amplifier 19 shown in FIG. 7A. As shown in FIG. 7B, an output level R1 of the DC offset transient response component (MHz) becomes relatively large and the sine wave signals are not amplified sufficiently. It has been confirmed that this phenomenon also occurs in case that there is no gain switching of the variable amplifier 23 of the intermediate frequency amplifier circuit 19.

DC offset reduction technology has been developed conventionally in the technical field of mobile phones, for example. It cannot however be directly applied to a radar system. The frequency of IF band required in the technical field of a radar is extremely low. In case that a high-pass filter is used to acquire signals in this extremely low frequency band, a time constant of the high-pass filter need be greatly increased and hence is not practical. For example, in case an AC coupling type high-pass filter is used, a capacitor element of a large area is required and hence not suitable for size reduction and high integration.

For this reason, the configuration of the present embodiment shown in FIG. 1 and FIG. 2 is used and its operation is simulated as follows.

Control Operation of the Present Embodiment

Figure 8A:
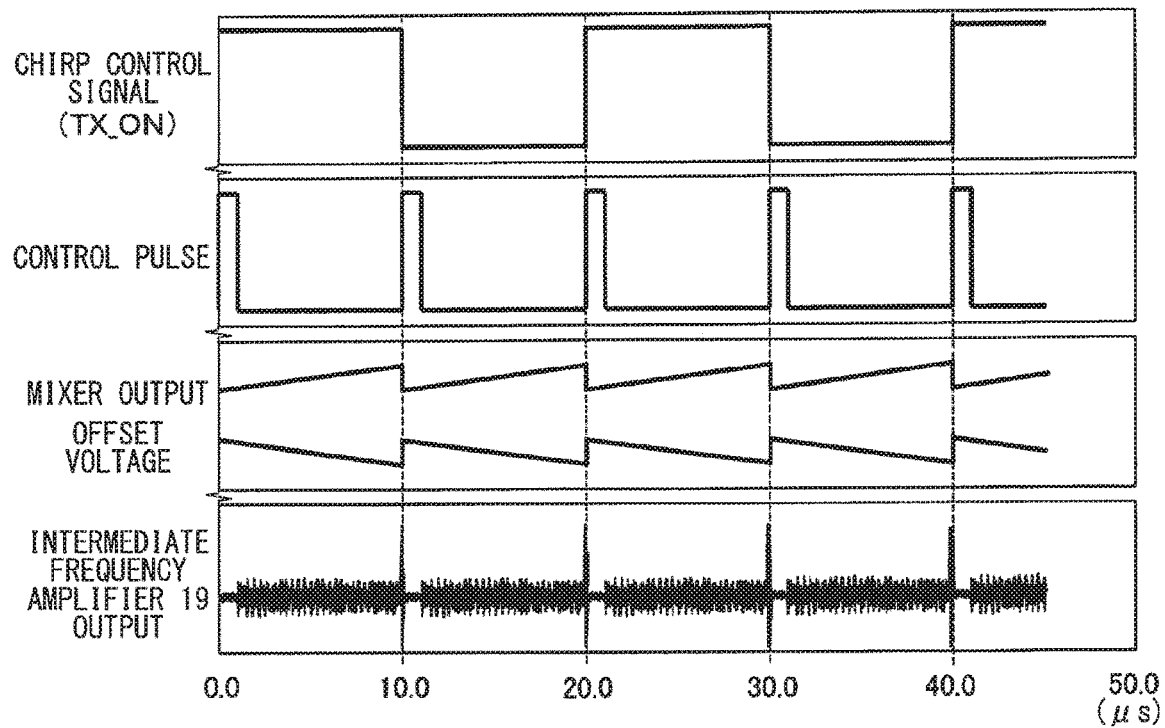
FIG. 8A is a chart showing a time change of a simulation result with a suppressed DC offset.
Figure 8B:
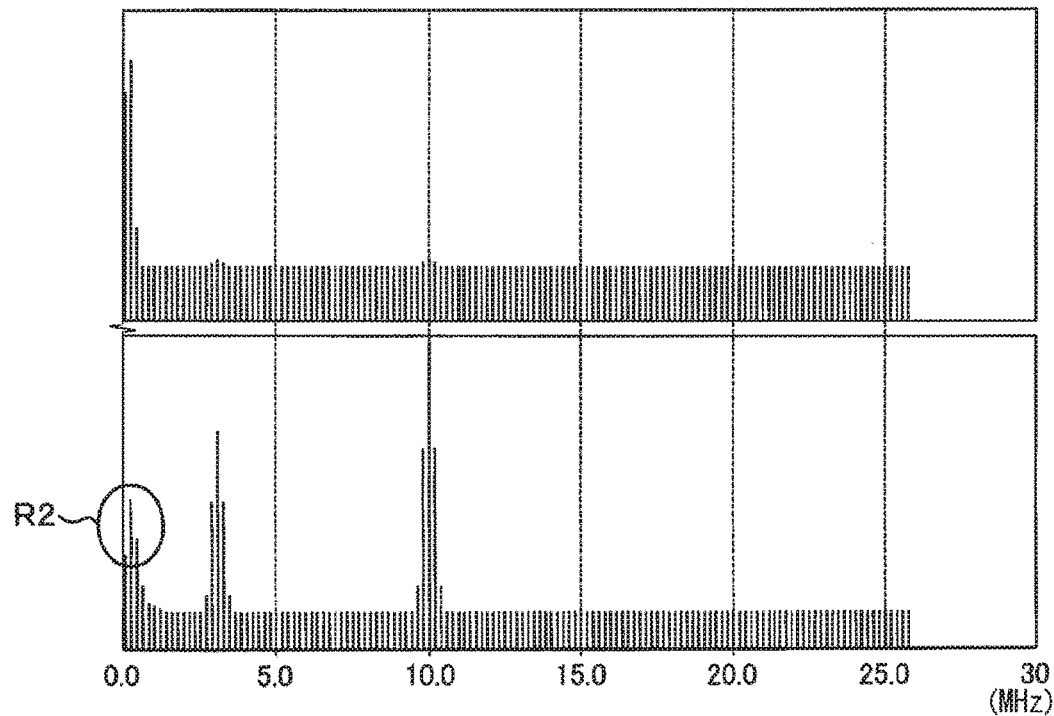
FIG. 8B is a chart showing a simulation result indicating frequency components with a suppressed DC offset.

FIG. 8A and FIG. 8B show simulation results in the present embodiment, in which the switches 37 and 38 are controlled to turn on for only the predetermined first period after starting of the chirp in conducting the similar simulation as conducted in the comparative example described with reference to FIGS. 7A and 7B. As shown in FIG. 8A, the control circuit 11a generates the control pulse "H" within the increase start period of the chirp frequency f during the period Tramp. When the switches 37 and 38 of the feedback circuit 24 shown in FIG. 2 are turned on, resistors 33 and 34 are short-circuited and the RC time constant becomes substantially zero. Therefore, according to the influence of the feedback circuit 24, the output of the variable amplifier 23 decreases to approximately 0 during this period. As a result, during the generation period of the control pulse "H," the DC offset transient response component can be reduced in accordance with the operation of the feedback circuit 24. For this reason, as the frequency component is shown in FIG. 8B, an output level R2 of the DC offset transient response component due to the frequency change of the local signal can be reduced in comparison to the level R1 shown in FIG. 7B.

That is, by starting to gradually increase the chirp frequency f, the output of the intermediate frequency amplifier circuit 19 can be reduced to 0 and the frequency signal in the IF band can also be cut off during the predetermined first period from the start of demodulation by the chirp frequency f. After that, as shown in FIG. 8A, when the control pulse is turned off (that is, "L") to turn off the switches 37 and 38, the frequency of the IF band can be transmitted to the subsequent stage as usual. Here, it shows the simulation result of turning on the switches 37 and 38 for only the predetermined first period to lower the output. It is confirmed that the effect is large even if the switches 37 and 38 are switched to turn on only for the predetermined first period from the start of the demodulation by the chirp frequency f. However, it is also possible to turn on the switches 37 and 38 during the predetermined second period after ending the demodulation.

Effect of Present Embodiment

As described above, according to the present embodiment, the intermediate frequency amplifier circuit 19 cuts off the frequency band including the DC offset transient response frequency, which is generated at the time of frequency conversion by the frequency conversion circuit 18 during the predetermined first period from the start of demodulation by the chirp frequency f using the frequency conversion circuit 18 and/or during a specified period defining the predetermined second period from the end of the demodulation. The intermediate frequency amplifier circuit 19, however, does not cut off the frequency band during a period other than the specified period. As a result, the DC offset transient response component can be reduced with good performance.

The control circuit 11 generates the chirp control signal TX_ON indicating the start and end of chirp demodulation. The control circuit 11a however detects the change in the chirp control signal TX_ON, determines the predetermined first period and the predetermined second period from the detection time, and generates the control signal to cut off the frequency band including the DC offset transient response component. Therefore, the predetermined first period and the predetermined second period can be defined in synchronization with the chirp control signal TX_ON.

The switches 37 and 38 are connected to switch the time constant of the high-pass filter of the feedback circuit 24 to be smaller than the period other than the specified period. Thus, by turning on and off the switches 37 and 38, it is possible to switch the time constant of the feedback circuit 24 for only a necessary period.

As described above, according to the present embodiment, when a direct conversion receiver of the radar system 1 is applied, the DC offset transient response component caused by the frequency change of the local signal LO can be suppressed. Further, it is possible to realize a DC feedback loop with a low cut-off frequency in case of cutting off the frequency band including such a DC offset transient response frequency. Thus it is possible to perform high gain operation.

Second Embodiment

Figure 9:
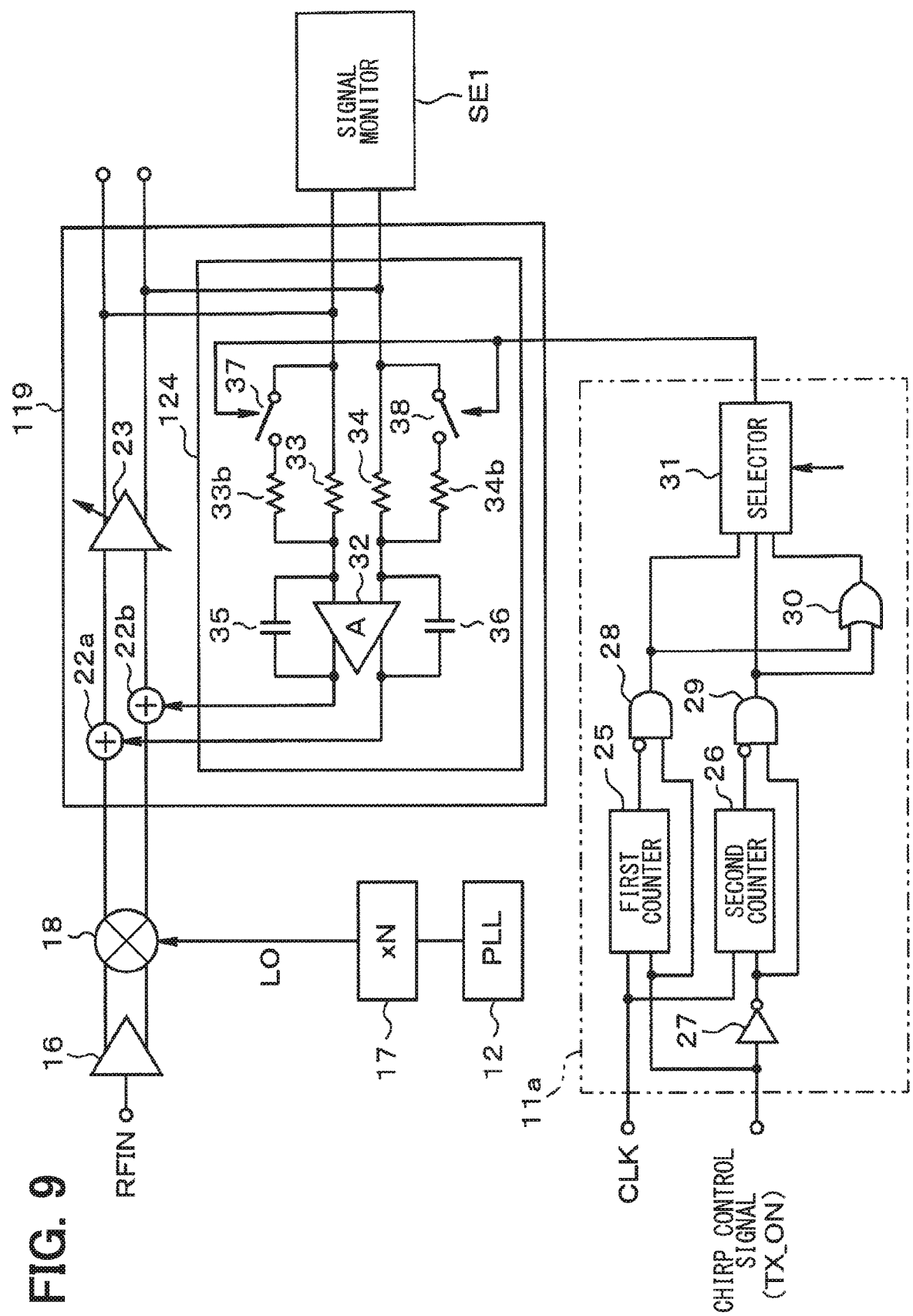
FIG. 9 is an electric circuit diagram showing a part of a radar signal processor and a control circuit according to one example of a second embodiment.
Figure 10:
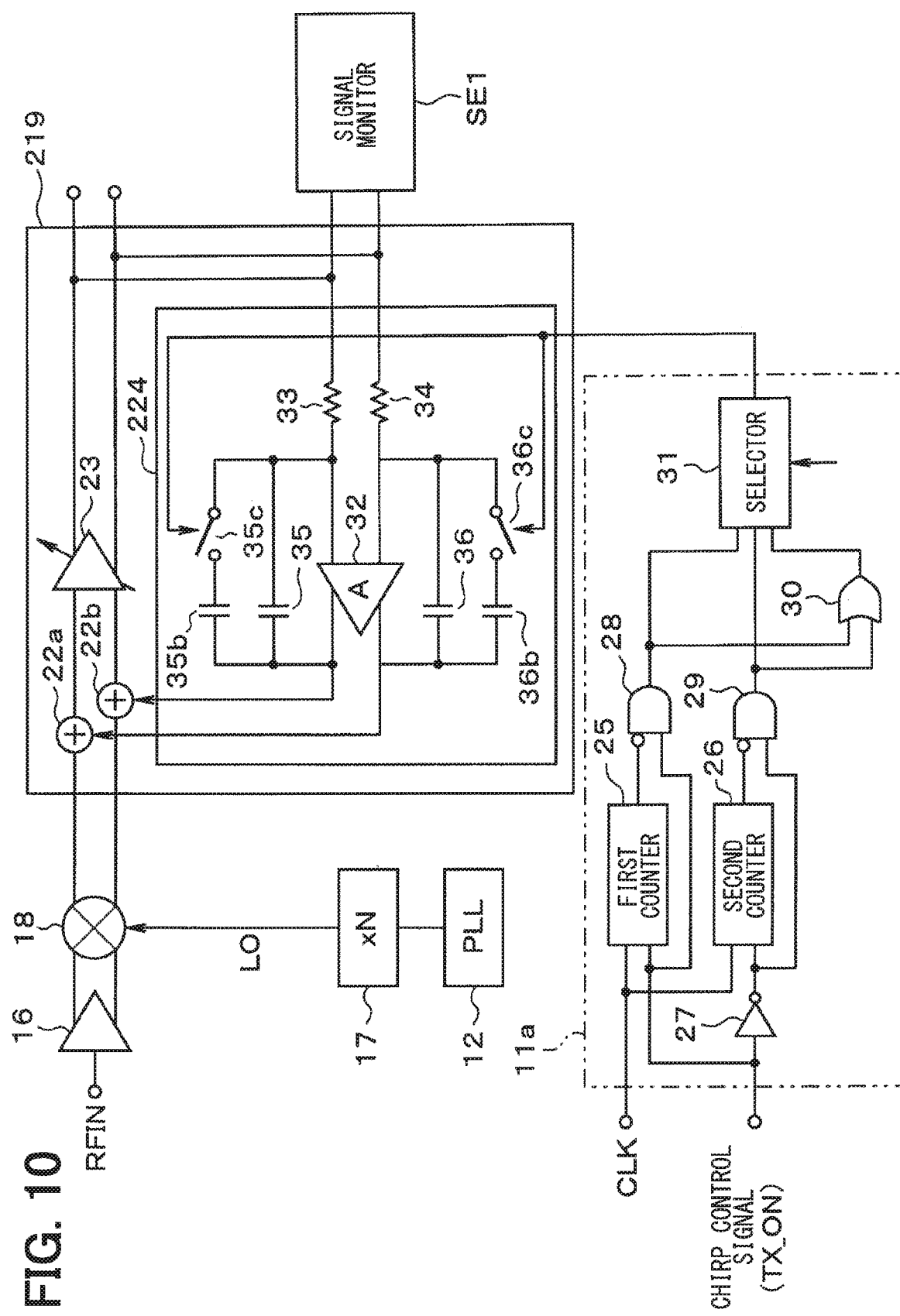
FIG. 10 is an electric circuit diagram showing a part of a radar signal processor and a control circuit according to another example of the second embodiment.
Figure 11:
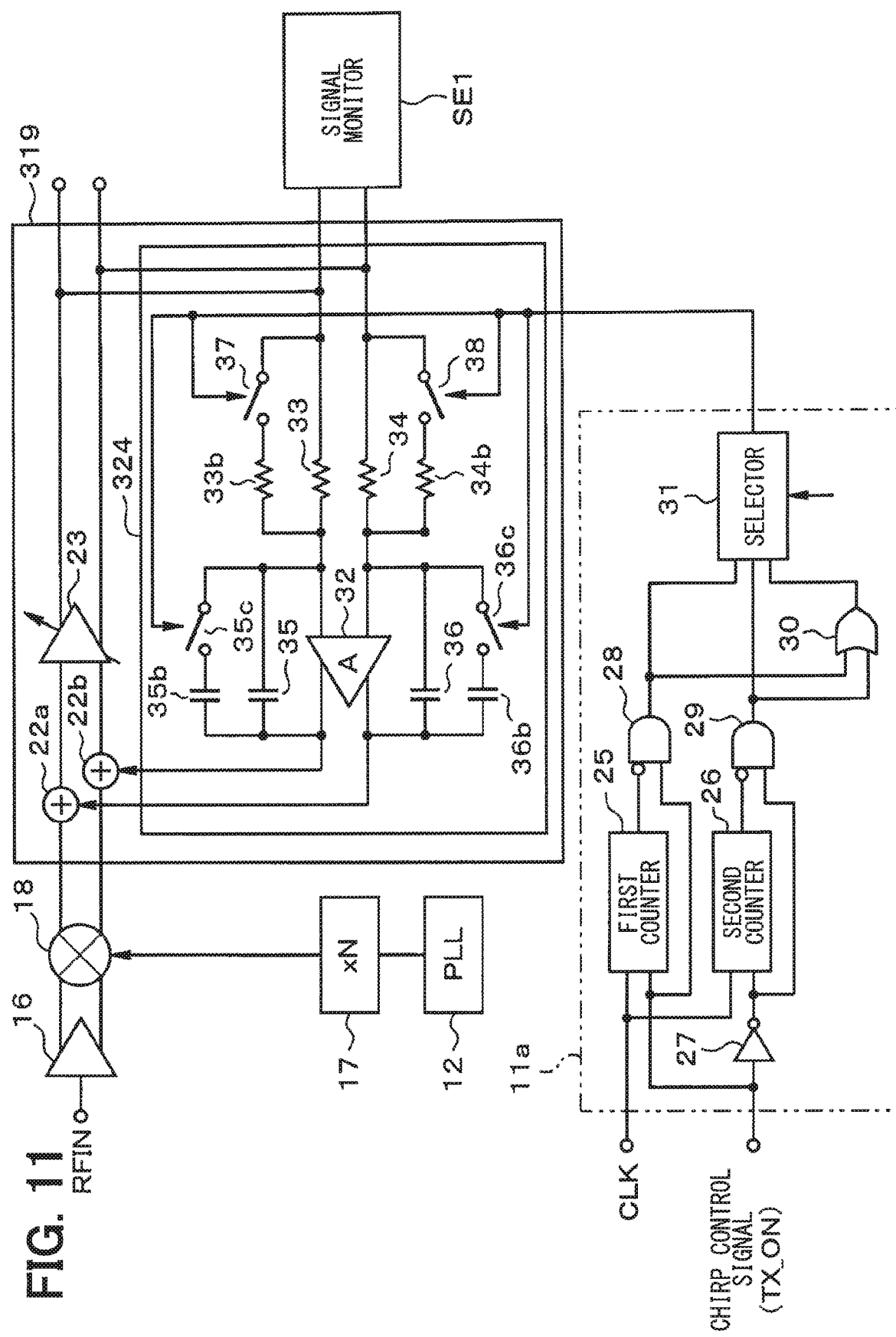
FIG. 11 is an electric circuit diagram showing a part of a radar signal processor and a control circuit according to the other example of the second embodiment.

A second embodiment shown in FIG. 9 to FIG. 11 is different from the first embodiment in the configuration of feedback circuits 124, 224 and 324. Hereinafter, the same parts as those in the first embodiment will be designated with the same reference numerals thereby to simplify the description. In addition, the same or similar configurations as the configuration described in the first embodiment are designated with reference numerals which are added with numbers 100, 200 and 300 to reference numerals assigned to the first embodiment so that different parts will be mainly described.

As a configuration for changing the RC time constant of the high-pass filter relating to the feedback circuit 24, the feedback circuits 124, 224 and 324 are configured as shown in FIG. 9, FIG. 10 and FIG. 11, respectively.

For example, in the feedback circuit 124 shown in FIG. 9, the feedback circuit 24 shown in FIG. 2 is provided as a basic structure. In addition, resistors 33b and 34b are provided in parallel with the resistors 33 and 34, respectively. The switch 37 is provided in series with the resistor 33b and the switch 38 is provided in series with the resistor 34b. Thus a parallel resistance of the resistors 33 and 33b can be variably controlled, and a parallel resistance of the resistors 34 and 34b can be variably controlled. The control circuit 11a turns on and off the switches 37 and 38, thereby varying an RC time constant of a high-pass filter of the feedback circuit 124. As such, similar effects as the first embodiment are achieved.

In the feedback circuit 224 shown in FIG. 10, the feedback circuit 24 shown in FIG. 2 is provided as a basic structure. In addition, a capacitor 35b is connected in parallel with the capacitor 35 and a switch 35c is connected in series with the capacitor 35b. A capacitor 36b is connected in parallel with the capacitor 36 and a switch 36c is connected in series with the capacitor 36b. Thus, a parallel capacitance of the capacitors 35 and 35b can be variably controlled, and a parallel capacitance of the capacitors 36 and 36b can be variably controlled. The control circuit 11a turns on and off the switches 35c and 36c, thereby varying an RC time constant of a high-pass filter of the feedback circuit 224. As such, similar effects as the first embodiment are achieved.

Further, as shown in the configuration of the feedback circuit 324 in FIG. 11, it is also possible to combine the circuit configurations shown in FIG. 9 and FIG. 10 for controllably varying a time constant. That is, the control circuit 11a may variably control the parallel capacitance of the capacitors 35 and 35b and variably control the parallel capacitance of the capacitors 36 and 36b to thereby variably control the time constant. The control circuit 11a may also variably control the parallel resistance of the resistors 33 and 33b and variably control the parallel resistance of the resistors 34 and 34b to thereby variably control the time constant. As such, similar effects as the first embodiment are achieved.

Third Embodiment

Figure 12:
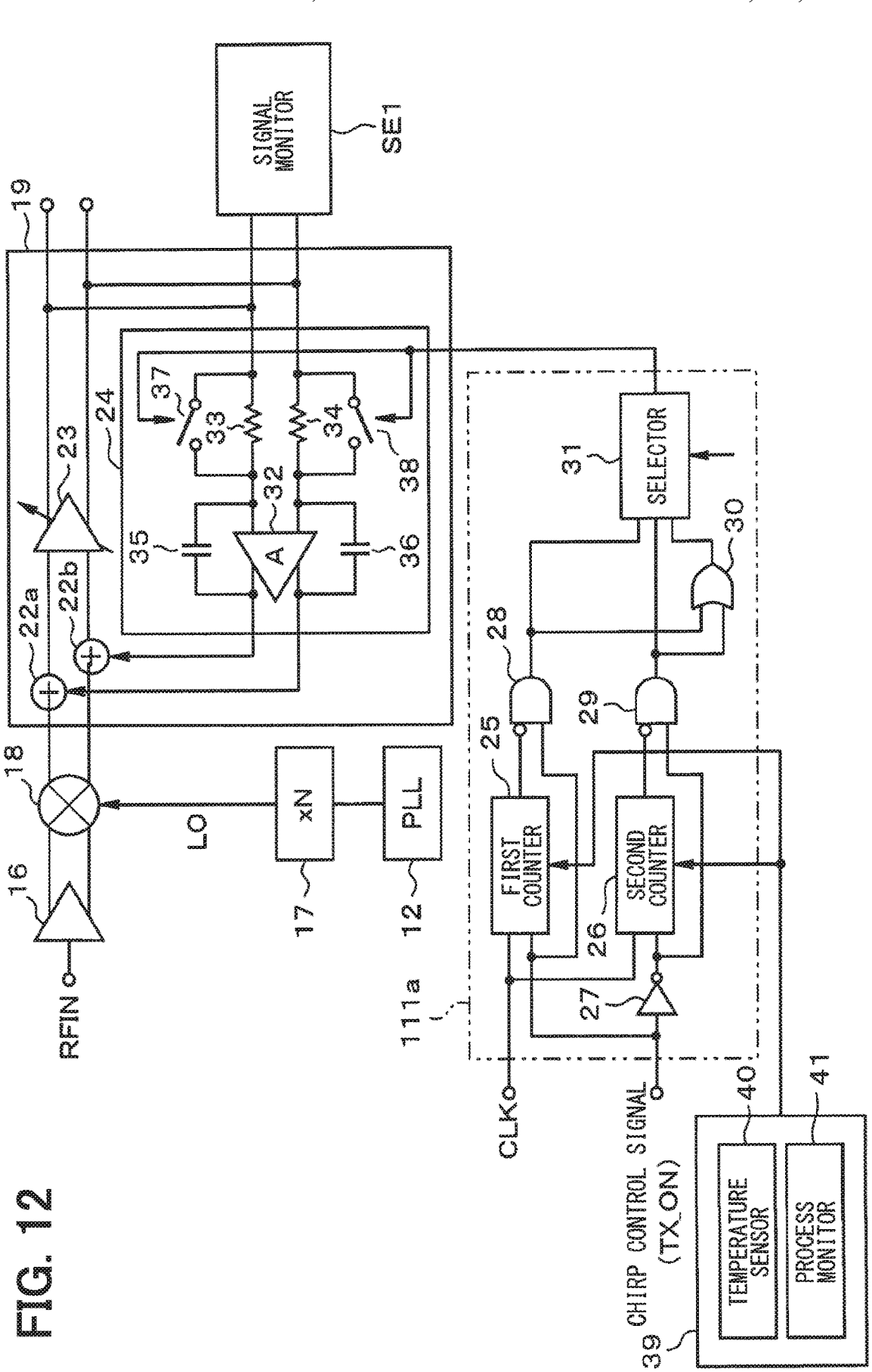
FIG. 12 is an electric circuit diagram showing a part of a radar signal processor and a control circuit according to a third embodiment.

A third embodiment shown in FIG. 12 is different from the first embodiment in that various sensors 39 are provided. The same structural parts as those in the first embodiment are designated with the same reference numerals, and only differences from the first embodiment will be described. As shown in FIG. 12, various sensors 39 such as a temperature sensor 40 and a process monitor 41 may be provided to adjust the threshold values of the counters 25 and 26.

For example, the time constant of the feedback circuit 24 is usually determined in correspondence to a product of the resistances of the resistors 33 and 34 and the capacitances of the capacitors 35 and 36. In addition, this time constant also varies depending on manufacturing variations in the process of manufacturing the transceiver-equipped IC 2 and changes in an operating environment temperature. Therefore, it is preferable to provide in the transceiver-mounted IC 2 the process monitor 41, which detects variations in circuit characteristics based on the resistances of the resistors 33, 34 and the capacitances of the capacitors 35, 36. A control circuit 111a provided as an adjustment control circuit adjusts a width of the control pulse by varying the first threshold value and the second threshold value of the counters 25 and 26 according to the detection result of the process monitor 41 to thereby decrease the DC offset transient response component. Further, the temperature sensor 40 may be provided for detecting the operating environment temperature of the transceiver-mounted IC 2 (for example, feedback circuit 24). The control circuit 111a preferably adjusts the width of the control pulse and decreases the DC offset transient response component by varying the first threshold value and the second threshold value of the counters 25 and 26 according to the detection result of the temperature sensor 40.

That is, the control circuit 111a can adjust the length of the predetermined first period according to the detection result of the temperature sensor 40 or the process monitor 41. The control circuit 111a can adjust and control the period during which the DC offset transient response component is decreased according to the actual element values of the resistors 33, 34 and the capacitors 35, 36 of the feedback circuit 24 in the intermediate frequency amplifier circuit 19.

Fourth Embodiment

Figure 13:
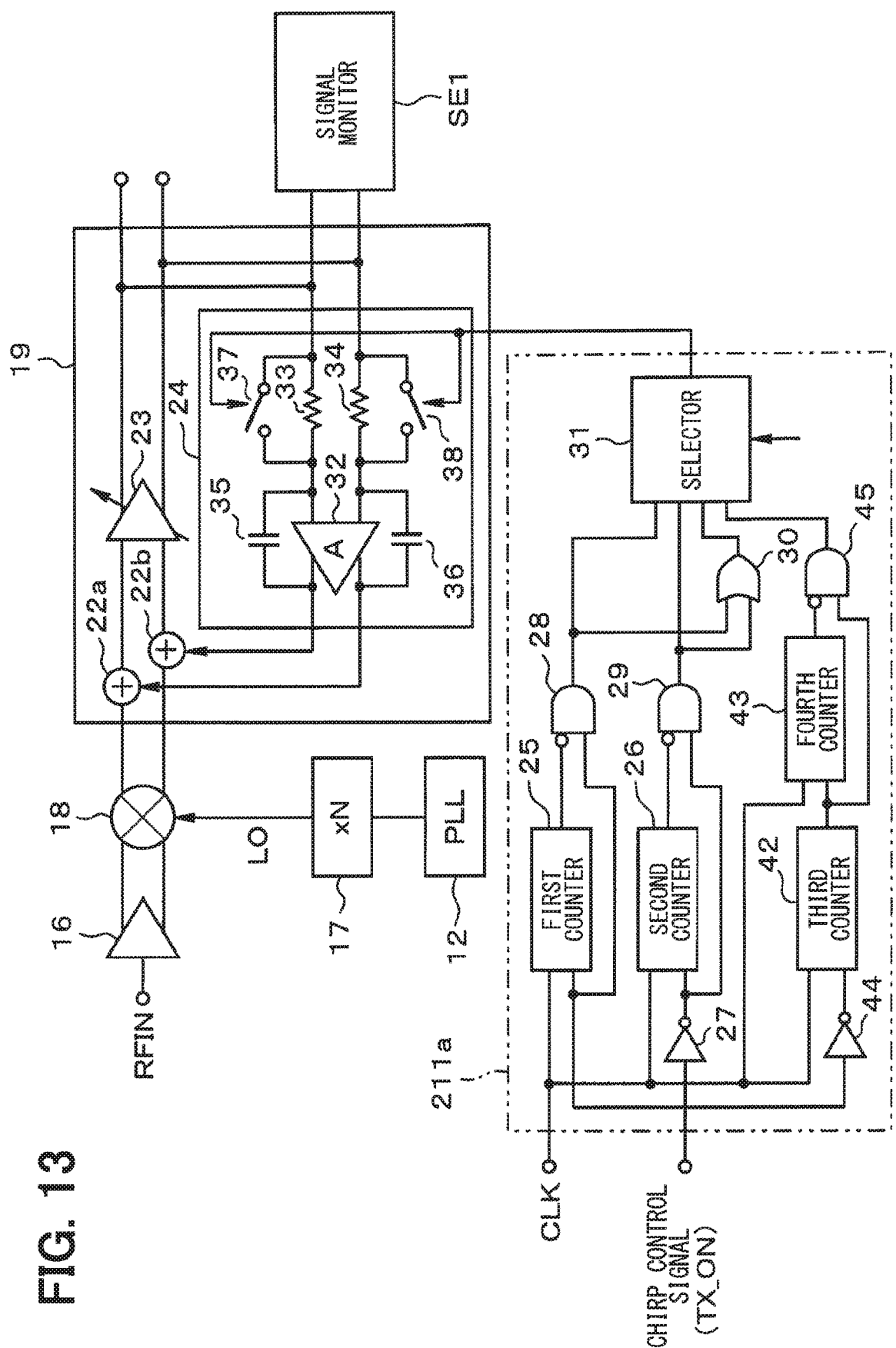
FIG. 13 is an electric circuit diagram showing a part of a radar signal processor and a control circuit according to a fourth embodiment.
Figure 14:
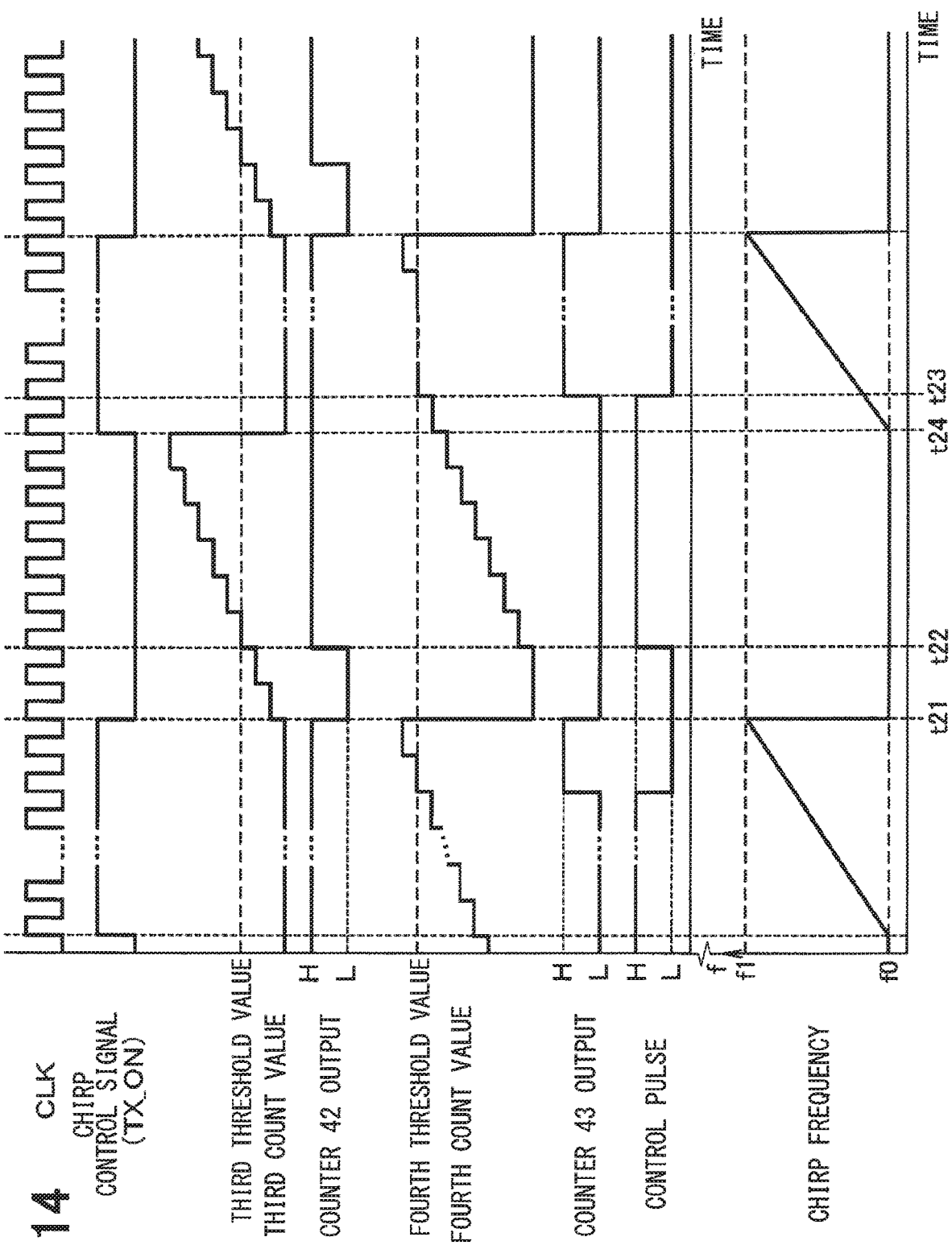
FIG. 14 is a time chart schematically showing a method of generating a control pulse for setting a mask period after ending a chirp until starting a chirp.

A fourth embodiment shown in FIG. 13 and FIG. 14 is different from the first embodiment in that the frequency band including at least the time of starting the modulation is cut off by starting to cut off the frequency band related to the DC offset transient response component from time, which is before starting the demodulation next time after ending the demodulation by the chirp frequency f and returning to the initial frequency f0.

FIG. 13 shows a configuration example as a replacement of FIG. 2. A control circuit 211a generates a control pulse in correspondence to the chirp control signal TX_ON and the reference clock CLK and generates control signals to the switches 37 and 38 of the feedback circuit 24. In the control circuit 211a, the counters 25, 26, the AND gates 28, 29, the NOT gate 27 and the OR gate 30 are connected in the same manner as in the control circuit 11a of the first embodiment shown in FIG. 2, and hence the description thereof will be omitted. The control circuit 211a includes, in addition, a third counter 42, a fourth counter 43, a NOT gate 44 and an AND gate 45.

The third counter 42 receives the chirp control signal TX_ON through the NOT gate 44 and counts the reference clock CLK while the chirp control signal TX_ON is "L." The third counter 42 outputs "H" to the fourth counter 43 when its count value reaches a predetermined third threshold value. In addition, the fourth counter 43 receives and counts the reference clock CLK while an output signal of the third counter 42 is "H."

The AND gate 45 receives an output signal of the fourth counter 43 in an inverted logic level and the output signal of the third counter 42, and outputs an AND logic operation result to the selector 31. The selector 31 selects either one of output signals of the AND gates 28, 29, 45 and the OR gate 30 based on the control signal of the control circuit 11 and applies a selected output as the control signal for the switches 37 and 38 of the feedback circuit 24. As a result, the control circuit 211a can change and control an RC time constant of a high-pass filter related to the feedback circuit 24 by controlling the switches 37 and 38 of the feedback circuit 24 to turn on and off.

As shown in FIG. 14, when the selector 31 selects the output of the AND gate 45, the third counter 42 starts counting the clock from time t21 at which the chirp control signal TX_ON changes to "L." When a third count value of the third counter 42 reaches a predetermined third threshold value at time t22, the fourth counter 43 starts counting from this time t22.

At time t22 at which the fourth counter 43 starts to count the clock, the control circuit 211a inputs the output of the AND gate 45 to the selector 31 and raises the control pulse to "H" in response to this input signal. Thereafter, when a count value of the fourth counter 43 reaches a predetermined fourth threshold value at time t23, "H" is input to an inverted input of the AND gate 45. At this time t23, the control pulse is changed to "L."

The third threshold value of the counter 42 and the fourth threshold value of the counter 43 are pre-adjusted such that the control pulse is "H" at time including time t24 at which the demodulation is started with at least the next chirp frequency f after returning to the initial frequency f0 at time t21 at which the demodulation is ended with the previous chirp frequency f. Therefore, it is possible to continue the control pulse from certain time t22 after the end of the chirp demodulation to time t23 after starting the chirp. Since a rising period of the control pulse is set so as to include time t24 at which the chirp frequency f starts to change from the initial frequency f0, fluctuation related to the DC offset transient response occurring at the change start time of the chirp frequency f can be suppressed.

By separately setting the third threshold value and the fourth threshold value, it is possible to change the delay time amount from the rise time of the chirp control signal TX_ON and the pulse width of the control pulse, respectively.

Fifth Embodiment

Figure 15:
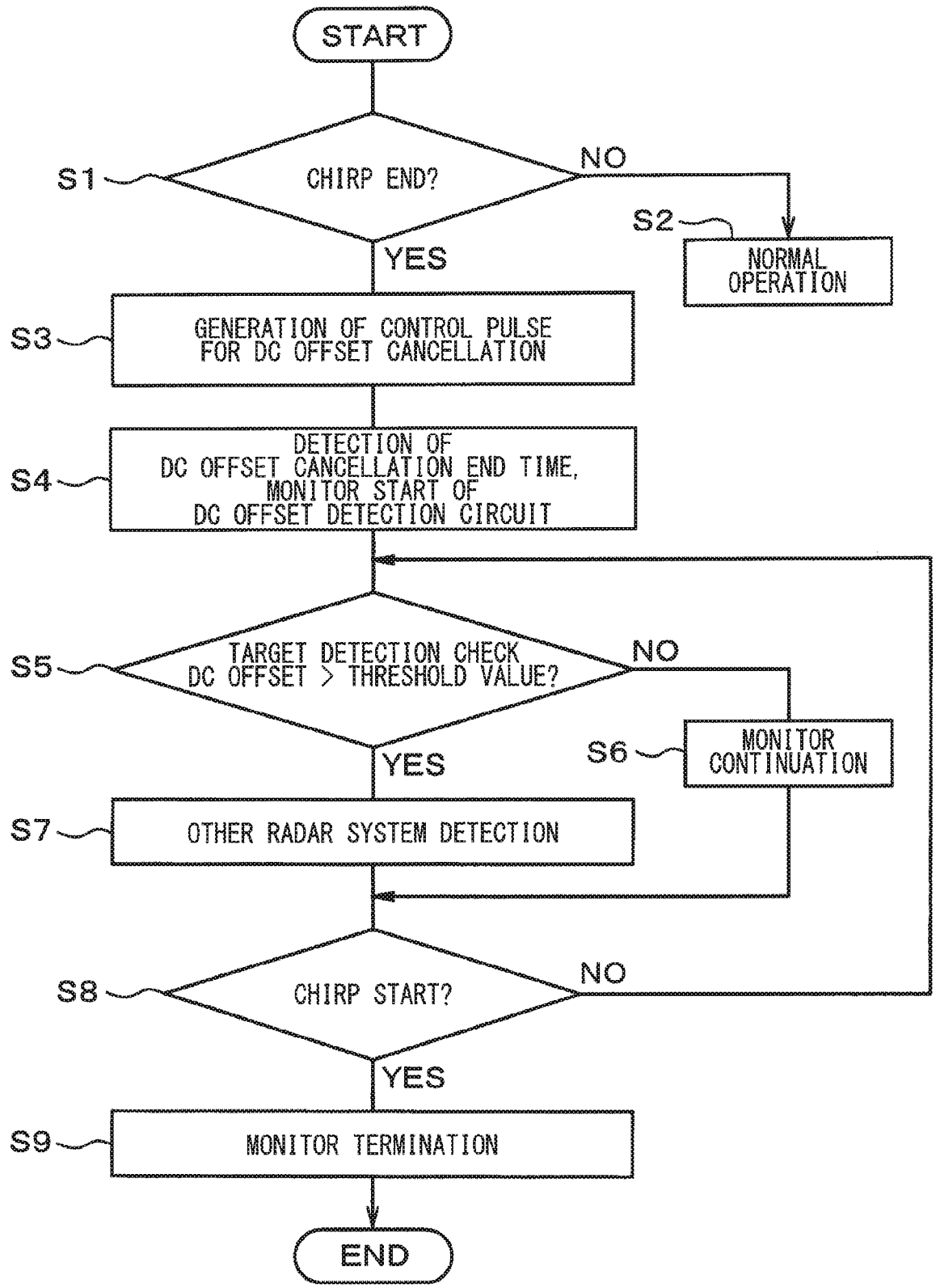
FIG. 15 is a flowchart schematically showing a noise cancellation process in a subject radar system.

A fifth embodiment is shown in FIG. 15 to FIG. 17. FIG. 15 schematically shows an operation in a flowchart form for detecting a signal arriving from the other radar system B assuming that the subject radar system is a radar system A. FIG. 16 schematically shows in a time chart an operation in case of detecting the signal arriving from the other radar system B.

First, processing will be described referring to FIG. 15. As shown in FIG. 15, at the time of starting the chirp control in the subject radar system A (for example, radar system 1 shown in FIG. 1), when it is determined at S1 that the chirp has not ended yet, the control circuit 11a operates normally at S2. When it is determined in step S1 that the chirp control has ended, the control circuit 11a generates and outputs the control pulse for DC offset cancellation at S3 is started. When the control circuit 11a detects the DC offset cancellation end time, the control circuit 11a causes the signal monitor SE1 to start monitoring at S4. Thereafter, the DC offset component can be detected when the controller 5 detects the target T. The controller 5 checks at S5 whether the DC offset component is larger than a predetermined threshold value.

At this time, if the DC offset is larger than the threshold value, the controller 5 determines in S7 that the other radar system B has been detected. Here, the controller 5 is provided as an other radar system check unit. If the DC offset is smaller than the threshold value, the controller 5 makes a negative determination (NO) in S5 and continues the monitoring by the signal monitor SE1 in S6. Then, the monitoring is continued by the signal monitor SE1 until the chirp is started again in S8. When the chirp is started again, the monitoring by the signal monitor SE1 is terminated in S9.

For example, in case that the control circuit 11a shown in FIG. 2 is employed and the control circuit 11a generates the control pulses at the time of starting and ending of the chirp to turn on the switches 37 and 38, it is possible to eliminate the DC offset component generated at the start of the chirp and the end of the chirp as shown in FIG. 16.

That is, after the chirp frequency f has gradually changed from the initial frequency f0 to the end frequency f1, the DC offset component is generated largely at this time so that the chirp frequency is transiently returned to the initial frequency f0. However, as shown at times t31 to t32 in FIG. 16, the differential output can be decreased to approximately 0 by generating the control pulse. For example, when the chirp frequency signal of the other radar system B changes rapidly at the time of arrival of the chirp frequency signal from the other radar system B at the receiver antenna 4 of the subject radar system A, the DC offset component is generated in the differential output of the intermediate frequency amplifier circuit 19 in the subject radar system A in response to the rapid change of the chirp frequency signal in the other radar system B.

Therefore, as shown in a period from time t33 to t34 in FIG. 16, the DC offset component due to the incoming wave of the other radar system B increases. The controller 5 detects this DC offset component by the signal monitor SE1 during the period Trest during which the subject radar system A stops chirping, and determines at S7 that the other radar system B has been detected on condition that the DC offset component exceeds the threshold value at S5 in FIG. 15. Thus, the presence of the other radar system B can be detected.

FIG. 17 shows a comparative example in case of no generation of a control pulse and hence no removal of a DC offset component. As shown in FIG. 17, the DC offset component is generated from time t41 at which the chirp frequency of the subject radar system A drops rapidly to the initial frequency f0. Thereafter, the intermediate frequency amplifier circuit 19 similarly generates the DC offset component from time t43 when the chirp frequency signal from the other radar system B changes rapidly at time t43.

That is, the DC offset component is generated in either case, that is, at time t41 and time t43. However, for example, when the DC offset component is saturated, it is impossible to determine whether the DC offset component is from the subject radar system A or from the other radar system B, and hence impossible to separate the DC offset component.

On the other hand, according to the present embodiment, as shown in the time chart of FIG. 16, the DC offset component generated from time t31 at which the chirp is ended can be removed before time t32.

Therefore, even if an interference wave due to the chirp frequency signal of the other radar system B arrives at the receiver antenna 4 of the subject radar system A at time t33, for example, the DC offset component rises from time t33. Thus, the DC offset component can be detected by the signal monitor SE1 during a detection period from time t33 to time t34. As a result, the controller 5 of the subject radar system A can determine an incoming signal from the other radar system B as an interference signal, and can determine the presence or absence of the other radar system B.

As described above, according to the present embodiment, the DC offset component occurring when a signal in the same frequency band as the chirp frequency f is inputted is detected after ending the demodulation by the chirp frequency f. It becomes possible to determine the presence or absence of the other radar system B operating in the same frequency band.

Other Embodiment

The present disclosure should not be limited to the embodiments described above, and various modifications may further be implemented. For example, the following modifications may be made.

Although the radar system 1 is assumed to operate in the millimeter wave band, it may be configured to operate in the other frequency band than the millimeter wave band. In the embodiments described above, the modulation and demodulation method is exemplified to gradually increase the frequency in the sawtooth wave shape. However, without being limited to such an example, the modulation and demodulation method may gradually decrease the frequency. Further alternatively, the modulation and demodulation method may be an FMCW system of linearly increasing the frequency and then linearly decreasing the frequency. That is, the modulation and demodulation method is not limited to that described in the present embodiment described above as far as the frequency changes gradually.

Although the feedback circuits 24, 124, 224 and 324 are provided with high-pass filters, but may alternatively be provided with band-pass filters. Although the period for cutting off the frequency band including the DC offset transient response frequency is set to the predetermined period which starts from the time of starting gradually increasing the chirp frequency f. However, the period for cutting off such a frequency band may be limited to only a predetermined period which starts from time of rapidly returning the chirp frequency f from the end frequency f1 to the initial frequency f0.

The predetermined first period is set from the rise time of the chirp control signal TX_ON and the predetermined second period is set from the fall time of the chirp control signal TX_ON. However, each of the predetermined first period and the predetermined second period may be set from time which takes into consideration a delay period of reflection at the target T. That is, it is desirable to cut off the frequency band including the DC offset transient response frequency by defining the predetermined first period and the predetermined second period from starting and ending of the demodulation by the chirp frequency f by using the frequency converter 18, respectively.

What is claimed is:

1. A radar signal processor for a radar system including a transmitter circuit, which transmits a radar wave having a chirp frequency gradually changing to a target, and a frequency conversion circuit, which demodulates a signal of the radar wave reflected at the target by frequency conversion in correspondence to the chirp frequency, the radar signal processor comprising:
an amplifier circuit including a variable amplifier and a feedback circuit, wherein:
the variable amplifier is connected to an output side of the frequency conversion circuit;
the feedback circuit is configured to detect an output signal of the variable amplifier as a detection signal and feeds back a signal of a frequency band included in the detection signal to an input of the variable amplifier; and
the amplifier circuit is configured to cut off and not cut off a frequency band including a DC offset transient response frequency, which occurs at time of frequency conversion by the frequency conversion circuit, during a specified period and a period other than the specified period, respectively, the specified period being a predetermined first period from starting of a demodulation operation of the frequency conversion circuit and/or a predetermined second period from ending of the demodulation operation of the frequency conversion circuit.

2. The radar signal processor according to claim 1, further comprising:
a chirp control signal generation circuit for generating a chirp control signal indicating a start and end of the chirp demodulation,
wherein the chirp control signal generation circuit includes a control pulse generation circuit for detecting a change in the chirp control signal, generating a control pulse of the specified period from a detection of the change in the chirp control signal thereby to cause a cut-off of the frequency band by the amplifier circuit.

3. The radar signal processor according to claim 1, wherein:
the feedback circuit includes a high-pass filter; and
bypass switches for switching a time constant of the high-pass filter of the feedback circuit during the specified period to be smaller than a period other than the specified period.

4. The radar signal processor according to claim 1, wherein:
the amplifier circuit sets the specified period to be only a predetermined period from starting the demodulation operation by the chirp frequency.

5. The radar signal processor according to claim 1, wherein:
the amplifier circuit cuts off the frequency band including at least time of a next starting of the demodulation operation by starting to cut off the frequency band from time, which is before starting the next demodulation operation after returning the chirp frequency to an initial frequency after ending the demodulation operation.

6. The radar signal processor according to claim 1, further comprising:
an adjustment control circuit for adjusting the specified period in accordance with a detection result of at least a temperature sensor connected to detect an operation environment temperature or at least a process monitor connected to detect a manufacturing process variation.

7. A radar system comprising:
the radar signal processor according to claim 1; and
a radar system check circuit for detecting a DC offset component, which occurs when a signal of a same frequency band as the chirp frequency is inputted, after ending of the demodulation operation by the chirp frequency, and checking whether an other radar system operating at the same frequency band is present based on a detection result.

* * * * *